(12) United States Patent
Lee et al.

(10) Patent No.: US 11,177,292 B2
(45) Date of Patent: Nov. 16, 2021

(54) DISPLAY DEVICE

(71) Applicant: LG Display Co., Ltd., Seoul (KR)

(72) Inventors: Jun-Yeob Lee, Gyeongsan-si (KR); Yang-Ho Cho, Gyeongsangbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 71 days.

(21) Appl. No.: 16/050,887

(22) Filed: Jul. 31, 2018

(65) Prior Publication Data

US 2019/0043892 A1 Feb. 7, 2019

(30) Foreign Application Priority Data

Aug. 2, 2017 (KR) .................. 10-2017-0098067

(51) Int. Cl.
*H01L 27/12* (2006.01)
*G09G 3/20* (2006.01)
*G09G 3/36* (2006.01)
*G09G 3/3266* (2016.01)
*H01L 27/32* (2006.01)
(Continued)

(52) U.S. Cl.
CPC ............ *H01L 27/124* (2013.01); *G09G 3/20* (2013.01); *G09G 3/3266* (2013.01); *G09G 3/3677* (2013.01); *G02F 1/13454* (2013.01); *G02F 1/136204* (2013.01); *G02F 1/136286* (2013.01); *G02F 2201/56* (2013.01); *G09G 2300/0408* (2013.01); *G09G 2300/0426* (2013.01); *G09G 2310/0281* (2013.01); *H01L 27/3276* (2013.01); *H01L 27/3288* (2013.01)

(58) Field of Classification Search
CPC .............. H01L 27/124; H01L 27/3276; H01L 27/3288; G02F 1/136286; G02F 2201/56; G02F 1/136204; G02F 1/13454; G09G 3/3648; G09G 3/3225; G09G 3/3266; G09G 3/3677; G09G 3/20; G09G 2300/0408; G09G 2310/0281; G09G 2300/0426
See application file for complete search history.

(56) References Cited

U.S. PATENT DOCUMENTS

| 2008/0203391 A1* | 8/2008 | Kim ................. G02F 1/1345 257/59 |
| 2008/0266210 A1* | 10/2008 | Nonaka ............... G09G 3/20 345/55 |

(Continued)

FOREIGN PATENT DOCUMENTS

| CN | 101295081 A | 10/2008 |
| CN | 102183860 A | 9/2011 |

(Continued)

OTHER PUBLICATIONS

Chinese Office Action dated Jan. 21, 2021 issued in Patent Application No. 201810870366.2 w/English Translation (18 pages).

*Primary Examiner* — Amit Chatly
(74) *Attorney, Agent, or Firm* — Polsinelli PC

(57) ABSTRACT

The present disclosure relates to a display panel including: a substrate including an active area for displaying an image, and a non-active area surrounding the active area; and a plurality of gate driving circuits arranged in the non-active area of the substrate, wherein the non-active area includes a straight portion and a corner portion, and the plurality of gate driving circuits is arranged only in the straight portion of the non-active area.

17 Claims, 3 Drawing Sheets

(51) Int. Cl.
G02F 1/1362 (2006.01)
G02F 1/1345 (2006.01)

(56) References Cited

U.S. PATENT DOCUMENTS

| | | | | |
|---|---|---|---|---|
| 2012/0112988 A1* | 5/2012 | Nakanishi | ......... | G02F 1/134309 345/76 |
| 2013/0044044 A1* | 2/2013 | Ha | .................... | G02F 1/136286 345/55 |
| 2015/0287382 A1* | 10/2015 | Lee | ...................... | G09G 3/3666 345/206 |
| 2017/0309644 A1* | 10/2017 | Yeh | ........................ | H01L 27/124 |
| 2018/0108677 A1* | 4/2018 | Yeh | ........................ | H01L 27/124 |

FOREIGN PATENT DOCUMENTS

| | | |
|---|---|---|
| CN | 202583659 U | 12/2012 |
| CN | 102956672 A | 3/2013 |

\* cited by examiner

DISPLAY DEVICE

CROSS REFERENCE TO RELATED APPLICATION

This application claims the benefit of Korean Patent Application No. 10-2017-0098067, filed on Aug. 2, 2017, which is hereby incorporated by reference in its entirety as if fully set forth herein.

BACKGROUND

Field of the Disclosure

The present disclosure relates to a display device, and more particularly, to a display panel having corner cut regions. Although the present disclosure is suitable for a wide scope of applications, it is particularly suitable for minimizing defects at rounded or cut corners during a manufacturing process of the display device.

Description of the Background

With the development of information society, various demands for display devices for displaying images increase and various display devices, such as a liquid crystal display (LCD) and an organic light-emitting diode (OLED) display device using an OLED are used.

Among these display devices, the LCD includes a liquid crystal display panel including a plurality of gate lines and a plurality of data lines displaying images, and a driving circuit for driving the liquid crystal display panel.

The driving circuit includes a gate driving circuit for driving the plurality of gate lines, a data driving circuit for driving the plurality of data lines, and a timing controller for supplying image data and various control signals to the gate driving circuit and the data driving circuit.

The display panel of the LCD includes a thin film transistor array substrate implemented by forming a thin film transistor array on a glass substrate, a color filter array substrate implemented by forming a color filter array on another glass substrate, and a liquid crystal layer filled between the thin film transistor array substrate and the color filter array substrate.

A voltage is applied to electric field generation electrodes (i.e., a pixel electrode and a common electrode) to generate an electric field in the liquid crystal layer, and arrangement of the liquid crystal molecules of the liquid crystal layer can be adjusted by the electric field to control polarization of incident light, thereby displaying an image.

The display panel for the LCD is implemented by bonding the thin film transistor array substrate with the color filter array substrate and is defined by an active area (AA) providing an image to a user and a non-active area (NA) corresponding to a peripheral of the active area AA.

The thin film transistor array substrate includes a plurality of gate lines GL extended in a first direction, a plurality of data lines DL extended in a second direction perpendicular to the first direction, and a sub-pixel (P) defined by each gate line and each data line.

A thin film transistor is formed at a sub-pixel P, and the gate electrode and the source electrode of each thin film transistor are respectively connected to a gate line and a data line.

In addition, a gate driver and a data driver are provided in the non-active area or outside the display panel to provide a scan pulse and a data signal to pixels of the plurality of gate lines and the plurality of data lines.

The gate driver may be simultaneously formed in the non-active area of the display panel when the plurality of signal lines (gate lines and data lines) and pixels of the display panel are formed. As a result, the gate driver is included in the display panel. This is often referred to as a gate-in-panel (GIP).

The gate driver described above includes a larger number of stages (referred to as "gate driving circuits" hereinafter) than the number of gate lines in order to sequentially supply a gate driving signal to the gate lines.

Meanwhile, display devices with improved aesthetics, which meet various demands of customers, have been recently spotlighted and thus a display panel having cut or rounded corners is proposed.

With regard to such a display panel having cut or rounded corners, various problems with respect to arrangement of internal components, particularly, a problem of defects caused by static electricity generated when the corners are cut or rounded, can be encountered.

SUMMARY

Accordingly, the present disclosure is to provide a display panel capable of minimizing defects generated at rounded corners during a manufacturing process.

In addition, the present disclosure is to provide a display panel capable of reducing a corner bezel.

A display panel according to the present disclosure to accomplish the objects includes: a substrate including an active area for displaying an image, and a non-active area surrounding the active area; and a plurality of gate driving circuits arranged in the non-active area of the substrate, wherein the non-active area includes a straight portion and a corner portion, and the plurality of gate driving circuits is arranged only in the straight portion of the non-active area.

Here, the substrate may further include a plurality of gate lines arranged in a first direction, and a plurality of data lines arranged in a second direction perpendicular to the first direction, and the gate lines are respectively electrically connected to the plurality of gate driving circuits.

The gate lines may be respectively electrically connected to the gate driving circuits through link lines.

The link lines may be formed of the same material as the plurality of data lines.

The link lines may electrically connect output terminals of the gate driving circuits to the gate lines.

The link lines may include first link lines connected to the gate lines, third link lines connected to the gate driving circuits and second link lines connecting the first and third link lines, the second link lines may be arranged in a direction diagonal to the first and second directions, and the first and second link lines are formed of the same material as the plurality of data lines.

In addition, a display panel according to the present disclosure to accomplish the objects includes: a substrate; first to n-th gate lines arranged at predetermined intervals in a first direction in an active area of the substrate; a plurality of data lines arranged in a second direction perpendicular to the first direction in the active area of the substrate; sub-pixels arranged at intersections of the first to n-th gate lines and the plurality of data lines; and first to n-th gate driving circuits formed in a non-active area of the substrate and respectively connected to the first to n-th gate lines, wherein the first gate driving circuit is shifted from the first gate line in the second direction.

Furthermore, a display panel according to the present disclosure to accomplish the objects includes: a substrate including an active area and a non-active area; a plurality of gate lines arranged in a first direction in the active area of the substrate; a plurality of data lines arranged in a second direction perpendicular to the first direction in the active area of the substrate; sub-pixels arranged at intersections of the plurality of gate lines and the plurality of data lines; and a plurality of gate driving circuits arranged in the non-active area of the substrate and respectively connected to the plurality of gate lines, wherein the spacing of the plurality of gate driving circuits is narrower than the spacing of the plurality of gate lines.

According to the display panel having the aforementioned features according to an aspect of the present disclosure, the size of a corner bezel can be reduced by modifying the structure of the gate driver.

In addition, the internal circuit of the gate driver can be prevented from being damaged due to static electricity generated during a manufacturing process.

Furthermore, it is possible to solve problems caused by an electric charge quantity difference due to metal layers connecting the gate lines to the gate driver.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

A display panel having the above-described features according to the present disclosure will be described in detail with reference to the attached drawings.

Figure 1:
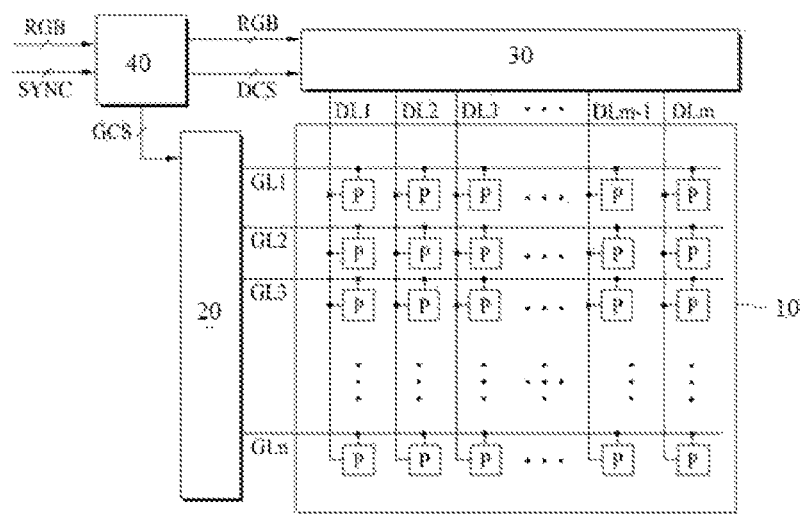
FIG. 1 is a diagram schematically illustrating a configuration of a flat panel display according to the present disclosure.
Figure 2:
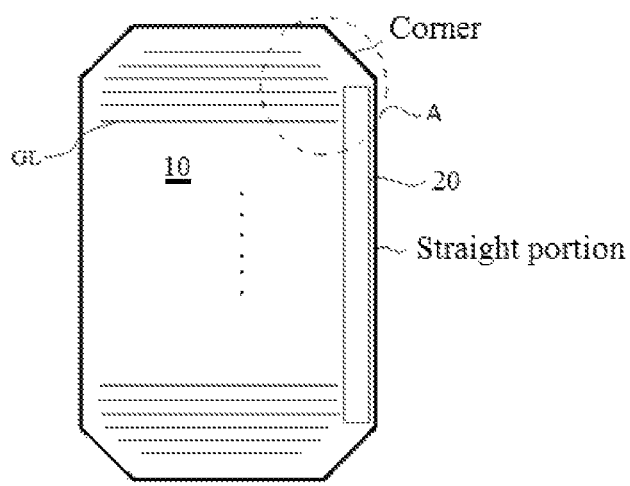
FIG. 2 is a diagram for describing a display panel according to the present disclosure.

FIG. 1 is a diagram schematically illustrating a configuration of a flat panel display according to the present disclosure and FIG. 2 is a diagram for describing a display panel according to the present disclosure.

As shown in FIG. 1, the flat panel display according to the present disclosure includes a display panel 10, a gate driver 20, a data driver 30 and a timing controller 40.

The display panel 10 includes a plurality of gate lines GL1 to GLn arranged at regular intervals in a first direction on a substrate, a plurality of data lines DL1 to DLm arranged at regular intervals in a second direction perpendicular to the first direction, and a plurality of sub-pixels P arranged at intersections of the plurality of gate lines GL1 to GLn and the plurality of data lines DL1 to DLm. The plurality of sub-pixels P displays an image according to an image signal (data voltage) supplied from the plurality of data lines DL1 to DLm in response to a scan pulse signal supplied from the gate lines GL1 to GLn.

When the display panel 10 is an LCD panel, each sub-pixel P includes a thin film transistor (TFT) which provides an image signal (data voltage) supplied from the corresponding data line to the sub-pixel in response to a scan pulse supplied from the corresponding gate line, and a capacitor storing the image signal (i.e., data voltage) supplied from the corresponding data line for one frame.

When the display panel 10 is an OLED display panel, each sub-pixel P may include an OLED, a driving transistor, a capacitor, and at least one switching transistor.

That is, the at least one switching transistor stores a data voltage supplied from the corresponding data line in the capacitor in response to a scan pulse supplied from the corresponding gate line, and the driving transistor controls current flowing through the OLED according to the data voltage stored in the capacitor to cause the OLED to emit light.

The gate driver 20 is configured as a gate shift register which sequentially supplies a scan pulse signal (gate driving signal) to the gate lines GL1 to GLn according to a plurality of gate control signals GCS provided from the timing controller 40.

The gate driver 20 includes a plurality of stages (often referred to as "gate driving circuits (GDC)" hereinafter) for sequentially supplying a scan signal (i.e., gate driving signal Vgout) to the plurality of gate lines GL1 to GLn.

The gate driver 20 is arranged in a non-active area of the display panel 10 when it is a GIP type gate driver.

The gate driver 20 includes a plurality of gate driving circuits, and the gate driving circuits correspond one-to-one to the plurality of gate lines such that one gate driving circuit supplies a scan signal to one gate line. Also, the gate driver 20 further includes a plurality of dummy gate driving circuits.

The data driver 30 converts digital image data RGB input from the timing controller 40 into an analog data voltage using a reference gamma voltage and provides the converted analog data voltage to the plurality of data lines DL1 to DLm. The data driver 30 is controlled by a plurality of data control signals DCS provided by the timing controller 40.

The timing controller 40 aligns image data RGB input from an external device to adapt image data RGB to the size and resolution of the display panel 10 and supplies the image data to the data driver 30. In addition, the timing controller 40 generates the gate control signals GCS and the data control signals DCS using signals input from an external device, for example, a dot clock signal, a data enable signal, a horizontal synchronization signal and a vertical synchronization signal, and respectively provides the gate control signals GCS and the data control signals DCS to the gate driver 20 and the data driver 30.

Although the display panel 10 generally has a rectangular shape, corners of the display panel 10 may be cut, as shown in FIG. 2, to meet various demands of customers. That is, the corners of the display panel having a rectangular shape with four straight sides are cut. Further, the gate driver 20 including the plurality of gate driving circuits GDC is not formed at a corner and is arranged only in a straight portion.

A manufacturing process when the display panel 10 is an LCD panel will be briefly described.

A plurality of display panel areas is defined on a first mother substrate and a TFT array is formed in each display panel area. In addition, a plurality of display panel areas is defined on a second mother substrate and a color filter array is formed in each display panel area.

Liquid crystal is dispensed or a sealing material is coated on at least one of the first and second mother substrates. The first and second mother substrates are aligned with each other and bonded to each other having a predetermined gap therebetween. Then, the bonded substrates are cut into the display panel areas through a cutting or scribing/braking process, producing display panels.

To manufacture the display panel as shown in FIG. 2 through the aforementioned process, the corners of the display panel are additionally cut through the cutting or scribing/braking process.

An OLED display device may also be manufactured by forming a plurality of OLED display panels on a mother substrate and then cutting the mother substrate into the respective display panels.

Accordingly, in the aforementioned display panel having corners cut, it is necessary to consider arrangement of internal components and defects caused by static electricity generated when the corners are cut.

Figure 3:
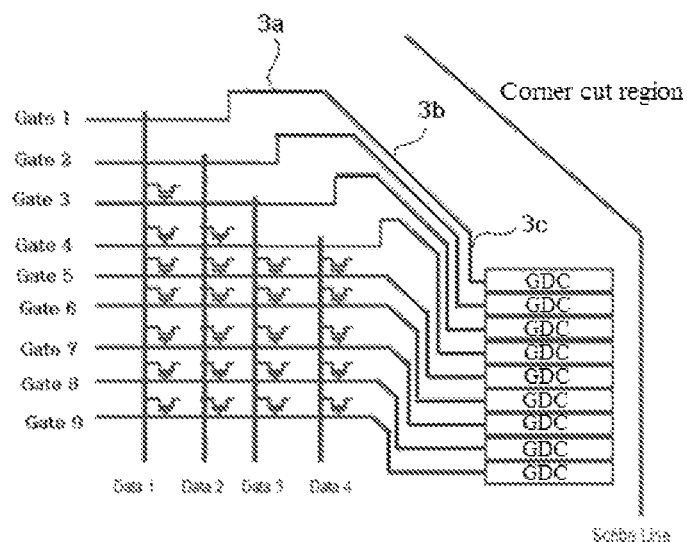
FIG. 3 is an enlarged view of part A of FIG. 2 illustrating a layout of the gate driver (or gate driving circuit) of the display panel according to the present disclosure.

FIG. 3 is an enlarged view of part A of FIG. 2 illustrating a layout of the gate driver (including the plurality of gate driving circuits GDC) of the display panel according to the present disclosure.

The display panel according to the present disclosure has a structure in which the corners are cut, as shown in FIG. 3.

Accordingly, the active area of the first substrate constituting the display panel includes a plurality of gate lines Gate 1, Gate 2, Gate 3, Gate 4, Gate 5, Gate 6, Gate 7, Gate 8, . . . arranged at predetermined intervals in one direction, and a plurality of data lines Data 1, Data 2, Data 3, Data 4, . . . arranged at predetermined intervals in a direction perpendicular to the gate lines Gate1, Gate 2, Gate 3, Gate 4, Gate 5, Gate 6, Gate 7, Gate 8, . . . to define a plurality of sub-pixels.

The gate driver 20 is formed in the non-active area of the display panel. The gate driver 20 includes a plurality of gate driving circuits GDC and is formed through a process of forming the TFT array of the active area. The gate driving circuits GDC are arranged such that sub-pixels of one horizontal line (i.e., gate line) are driven by one gate driving circuit GDC (i.e., the gate lines one-to-one corresponding to the gate driving circuits GDC).

The gate lines Gate 1, Gate 2, Gate 3, Gate 4, Gate 5, Gate 6, Gate 7, Gate 8, . . . are electrically connected to the gate driving circuits GDC through a plurality of link lines 3a, 3b and 3c.

The link lines 3a, 3b and 3c include first link lines 3a connected to the gate lines Gate 1, Gate 2, Gate 3, Gate 4, Gate 5, Gate 6, Gate 7, Gate 8, . . . , third link lines 3c connected to the gate driving circuits GDC, and second link lines 3b connecting the first link lines 3a to the third link lines 3c.

That is, the first and third link lines 3a and 3c are arranged in parallel with or perpendicularly to the gate lines, and the second link lines 3b are arranged in a diagonal direction.

Here, the gate driving circuits GDC are not formed in a diagonal portion having a corner cut and are arranged only in a straight portion.

Accordingly, link lines 3a, 3b and 3c connecting gate lines (e.g., Gate 1, Gate 2, Gate 3 and Gate 4) to gate driving circuits GDC, which correspond to a corner of the display panel, are formed longer than conventional ones.

When the link lines 3a, 3b and 3c connecting the gate lines to the gate driving circuits GDC are formed longer than conventional ones and formed using the same metal as the gate lines, a problem occurs with respect to the quantity of electric charges.

The display panel includes a first metal layer forming the gate lines and a second metal layer forming the data lines. Here, it is desirable that the quantity of deposition of the first metal layer is similar to the quantity of deposition of the second metal layer.

However, the gate driving circuits GDC are not formed in a diagonal portion having a corner cut region and are arranged only in a straight portion, as described above, and thus link lines 3a, 3b and 3c each connecting gate lines to gate driving circuits GDC, which correspond to a corner, become longer than the conventional ones. When the link lines 3a, 3b and 3c are formed of the same metal as the gate lines, the quantity of deposition of the first metal layer becomes greater than that of the second metal layer, resulting in a difference between the quantities of electric charges of the first and second metal layers.

Accordingly, the link lines 3a, 3b and 3c connecting the gate lines to the gate driving circuits GDC or some (second link lines represented in red) of the link lines 3a, 3b and 3c are formed of the same material (metal) as the data lines.

Figure 4:
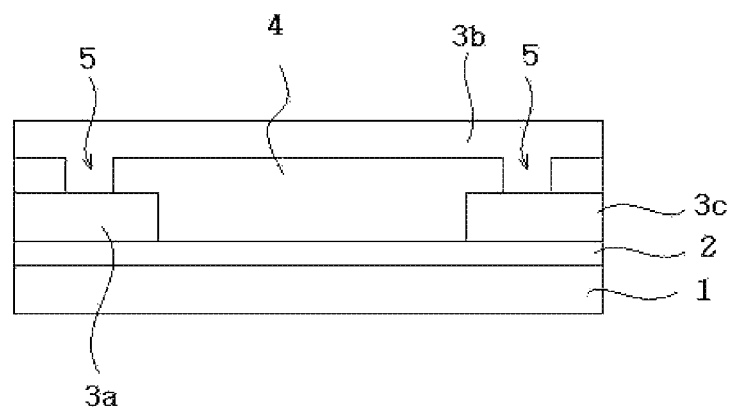
FIG. 4 is an enlarged cross-sectional view of link lines between gate driving circuits and gate lines in FIG. 3 according to an aspect of the present disclosure.

FIG. 4 is an enlarged cross-sectional view of link lines between gate driving circuits and gate lines in FIG. 3 according to an aspect of the present disclosure.

As shown in FIG. 4, a gate insulating layer 2 is formed on a substrate 1, and the first link lines 3a extended from the gate lines and the third link lines 3c connected to the gate driving circuits GDC are formed of the same material (metal) as the gate lines on the gate insulating layer 2.

That is, the first and third link lines 3a and 3c are simultaneously formed through a mask process for forming the gate lines. Accordingly, the first and third link lines 3a and 3c are formed of the same material (metal) as the gate lines on the same layer as the gate lines.

An interlayer insulating layer 4 is formed on the overall surface of the gate insulating layer 2 including the gate lines and the first and third link lines 3a and 3c, and contact holes 5 are formed on the first and third link lines 3a and 3c.

Then, the second link lines 3b are formed on the interlayer insulating layer 4 to be electrically connected to the first and third link lines 3a and 3c through the contact holes 5.

The second link lines 3b are simultaneously formed through a mask process for forming the data lines. Accordingly, the second link lines 3b are formed of the same material (metal) as the data lines Data 1, Data 2, Data 3, Data 4, . . . on the same layer as the data lines Data 1, Data 2, Data 3, Data 4, . . . .

Although only the second link lines 3b arranged in a diagonal direction are formed of the same material (metal) as the data lines Data 1, Data 2, Data 3, Data 4, . . . at the same level as the data lines Data 1, Data 2, Data 3, Data 4, . . . in FIGS. 3 and 4, the present disclosure is not limited thereto.

In another aspect, the first and second link lines 3a and 3b may be formed of the same material (metal) as the data lines Data 1, Data 2, Data 3, Data 4, . . . on the same layer as the data lines Data 1, Data 2, Data 3, Data 4, . . . .

Figure 5:
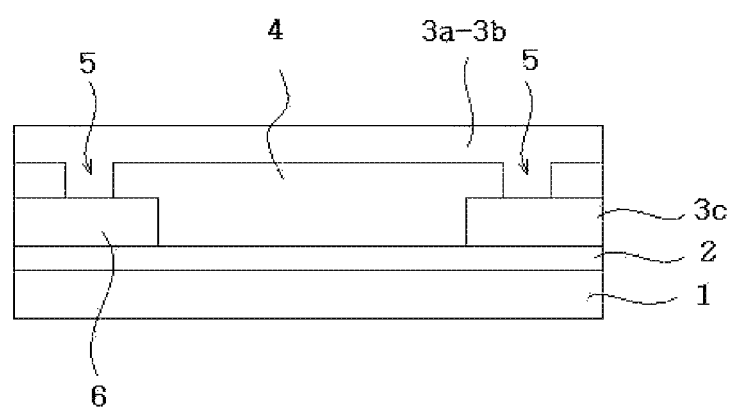
FIG. 5 is an enlarged cross-sectional view of link lines between gate driving circuits and gate lines in FIG. 3 according to another aspect of the present disclosure.

FIG. 5 is an enlarged cross-sectional view of link lines between gate driving circuits and gate lines in FIG. 3 according to another aspect of the present disclosure.

As shown in FIG. 5, the gate insulating layer 2 is formed on the substrate 1. Gate lines 6 are formed on the gate insulating layer 2, and the third link lines 3c are formed of the same material as the gate lines 6 and connected to the gate driving circuits GDC.

The third link lines 3c are formed through a mask process for forming the gate lines 6. Accordingly, the third link lines 3c are formed of the same material (metal) as the gate lines 6 on the same layer as the gate lines 6.

The interlayer insulating layer 4 is formed on the overall surface of the gate insulating layer 2 including the gate lines 6 and the third link lines 3c, and contact holes 5 are formed on the gate lines 6 and the third link lines 3c.

Then, the first and second link lines 3a and 3b are formed on the interlayer insulating layer 4 to be electrically connected to the gate lines 6 and the third link lines 3c through the contact holes 5.

The first and second link lines 3a and 3b are simultaneously formed through a mask process for forming the data lines. Accordingly, the first and second link lines 3a and 3b are formed of the same material (metal) as the data lines Data 1, Data 2, Data 3, Data 4, . . . on the same layer as the data lines Data 1, Data 2, Data 3, Data 4, . . . .

Although not shown, all of the first to third link lines may be formed of the same material (metal) as the data lines Data 1, Data 2, Data 3, Data 4, . . . .

As described above, the gate driving circuits GDC are formed in the non-active area of the display panel in a process of forming the plurality of signal lines (gate lines and data lines) and pixels of the display panel and output a scan signal for driving the gate lines. That is, the gate driving circuits GDC include output terminals outputting the scan signal.

Accordingly, the output terminals of the gate driving circuits GDC may be formed of the same material (metal) as the gate lines, and the first to third link lines 3a, 3b and 3c for connecting the output terminals of the gate driving circuits GDC to the gate lines 6, shown in FIG. 3, may be formed of the same material (metal) as the data lines Data 1, Data 2, Data 3, Data 4, . . . .

In the first and second aspects of the present disclosure, the gate lines Gate 1, Gate 2, Gate 3, Gate 4, Gate 5, Gate 6, Gate 7, Gate 8, . . . , the data lines Data 1, Data 2, Data 3, Data 4, . . . and the first to third link lines 3a, 3b and 3c may be formed of a single metal layer or multiple layers including at least two metal layers.

Although the gate lines are formed on the gate insulating layer 2 because TFTs are formed in a low temperature polysilicon (LTPS) structure in FIG. 4, the present disclosure is not limited thereto and the gate insulating layer may be formed on the gate lines when bottom gate type TFTs are formed.

As described above, some of the link lines connecting the gate lines to the gate driving circuits GDC are formed of the metal layer for forming the data lines, and thus the quantity of deposition of the metal layer for the gate lines is similar to the quantity of deposition of the metal layer for the data lines even if the link lines are longer than conventional ones. Accordingly, the quantities of electric charges of the two metal layers can be similar to each other and thus a problem caused by a difference between the quantities of electric charges can be solved.

Meanwhile, the gate driving circuits GDC are not formed in a diagonal portion having a corner cut region and are arranged only in a straight portion.

The gate driving circuits GDC need to be shifted to the straight portion in the direction of the data lines because the gate driving circuits GDC are not formed in a diagonal portion having a corner cut region of the display panel and are arranged only in the straight portion of the display panel, as described above. Accordingly, the gate driving circuits GDC are integrated having a narrower spacing than that of the gate lines.

In this manner, the gate driving circuits GDC are not formed in a diagonal portion having a corner cut region and are arranged only in a straight portion, and some of the link lines connecting the gate lines to the gate driving circuits GDC are formed of the metal layer for the data lines, and thus a corner bezel can be reduced.

For example, a corner bezel has a size of 1.5 mm in the conventional display panel in which gate driving circuits GDC are formed at a corner, whereas the size of the corner bezel is reduced to 1.0 mm in the display panel of the present disclosure because the gate driving circuits GDC are not formed in a diagonal portion having a corner cut region and some of the link lines connecting the gate lines to the gate driving circuits GDC are formed of the metal layer for the data lines.

To manufacture the display panel having corner cut regions, it is necessary to perform the scribing/braking process twice in order to divide the mother substrate into unit display panels and to cut the corners.

When the gate driving circuits GDC are formed in a corner region which causes the scribing/braking process to be performed twice, there is a high possibility that internal components of the gate driving circuits GDC are damaged due to static electricity generated when the scribing/braking process is performed twice. However, the present disclosure does not form the gate driving circuits GDC in a diagonal portion having a corner cut region of the display panel and thus can prevent the internal components of the gate driving circuits GDC from being damaged due to static electricity generated during the scribing/braking process.

Although the aspects of the present disclosure have been described above, those skilled in the art will appreciate that various modifications and variations can be made in the present disclosure without departing from the spirit or scope of the present disclosure disclosed in the appended claims.

What is claimed is:

1. A display panel comprising:
    an active area and a non-active area defined at a substrate, the active area for displaying an image and the non-active area surrounding the active area;
    a plurality of gate driving circuits arranged in the non-active area of the substrates;
    a plurality of gate lines and a plurality of data lines crossing each other at the active area and formed on different layers; and
    a plurality of link lines electrically connecting the plurality of gate line to the plurality of gate driving circuits,
    wherein the non-active area includes a straight portion and a corner cut portion, and the plurality of gate driving circuits are arranged only at the straight portion,
    wherein the plurality of link lines disposed only at the corner cut portion except for the straight portion are formed of the same material as the plurality of data lines and disposed on the same layer as the plurality of data lines to reduce difference between a quantity of deposition of the plurality of gate lines and a quantity of deposition of the plurality of data lines, and
    wherein each of the plurality of link lines includes first, second and third link lines, the first and third link lines are connected through the second link line that is located above the third link line, the first link line is directly connected to one of the plurality of gate lines, and the third link line is directly connected to one of the plurality of gate driving circuits, and wherein the second link line is disposed only at the corner cut portion except for the straight portion, and only the second link line is formed of the same material as the plurality of data lines and disposed on the same layer as the plurality of data lines to reduce difference between a quantity of deposition of the plurality of gate lines and a quantity of deposition of the plurality of data lines.

2. The display panel according to claim 1, wherein the plurality of gate lines are arranged on the substrate in a first direction, and the plurality of data lines are arranged on the substrate in a second direction perpendicular to the first direction.

3. The display panel according to claim 2, wherein the plurality of gate lines are electrically connected to the plurality of gate driving circuits with a one-to-one correspondence relationship.

4. The display panel according to claim 3, wherein the plurality of gate driving circuits are integrated to have a spacing narrower than that of the plurality of gate lines.

5. The display panel according to claim 3, wherein the plurality of link lines electrically connect output terminals of the plurality of gate driving circuits to the plurality of gate lines.

6. The display panel according to claim 1, wherein the second link line is arranged in a diagonal direction with respect to the first and second directions.

7. The display panel according to claim 1, wherein the first link line is formed of the same material as the plurality of data lines.

8. The display panel according to claim 1, wherein the second link lines are connected to both of the first link line and the third link line through contact holes in an interlayer insulating layer.

9. A display panel comprising:
first to n-th gate lines arranged at predetermined intervals in a first direction at an active area defined on a substrate having a straight portion and a corner cut portion;
a plurality of data lines arranged in a second direction perpendicular to the first direction at the active area, wherein the first to n-th gate lines and the plurality of data lines are formed on different layers;
a plurality of sub-pixels arranged at intersections of the first to n-th gate lines and the plurality of data lines;
first to n-th gate driving circuits formed at a non-active area defined on the substrate and respectively connected to the first to n-th gate lines; and
a plurality of link lines electrically connecting the first to n-th gate lines to the first to n-th gate driving circuits,
wherein the first gate driving circuit is shifted from the first gate line in the second direction,
wherein each of the plurality of link lines includes first, second and third link lines, the first and third link lines are connected through the second link line that is located above the third link line, the first link line is directly connected to one of the first to n-th gate lines and the third link line is directly connected to one of first to n-th gate driving circuits, and
wherein the second link line is disposed only at the corner cut portion except for the straight portion, and only the first link line and the second link line are formed of the same material as the plurality of data lines, or only the second link line is formed of the same material as the plurality of data lines to reduce difference between a quantity of deposition of the plurality of gate lines and a quantity of deposition of the plurality of data lines.

10. The display panel according to claim 9, wherein the first to n-th gate lines are electrically connected to the first to n-th gate driving circuits with a one-to-one correspondence relationship.

11. The display panel according to claim 9, wherein the second link line is arranged in a diagonal direction with respect to the first and second directions.

12. The display panel according to claim 9, wherein the first to n-th gate driving circuits are integrated to have a spacing narrower than that of the plurality of gate lines.

13. The display panel according to claim 9, wherein the first to n-th gate driving circuits are arranged only in the straight portion.

14. The display panel according to claim 9, wherein the second link line is connected to both of the first link line and the third link line through contact holes in an interlayer insulating layer.

15. A display panel comprising:
an active area and a non-active area defined on a substrate having a straight portion and a corner cut portion;
a plurality of gate lines arranged in a first direction at the active area;
a plurality of data lines arranged in a second direction perpendicular to the first direction in the active area, wherein the plurality of gate lines and the plurality of data lines are formed on different layers;
a plurality of sub-pixels arranged at intersections of the plurality of gate lines and the plurality of data lines;
a plurality of gate driving circuits arranged in the non-active area and respectively connected to the plurality of gate lines; and
a plurality of link lines electrically connecting the plurality of gate line to the plurality of gate driving circuits,
wherein each of the plurality of link lines includes first, second and third link lines, the first and third link lines are connected through the second link line that is located above the third link line, the first link line is directly connected to one of the plurality of gate lines, and the third link line is directly connected to one of the plurality of gate driving circuits,
wherein each of the plurality of gate driving circuits is separated from each other with a distance narrower than that of the plurality of gate lines,
wherein the second link line is disposed only at the corner cut portion except for the straight portion and only the second link line is formed of the same material as the plurality of data lines and disposed on the same layer as the plurality of data lines to reduce difference between a quantity of deposition of the plurality of gate lines and a quantity of deposition of the plurality of data lines.

16. The display panel according to claim 15, wherein the plurality of gate lines are electrically connected to the plurality of gate driving circuits with a one-to-one correspondence relationship.

17. The display panel according to claim 15, wherein the second link line is arranged in a diagonal direction with respect to the first and second directions.

* * * * *